(12) United States Patent
Hartzog

(10) Patent No.: US 7,969,275 B2
(45) Date of Patent: Jun. 28, 2011

(54) FUSE ASSEMBLY WITH INTEGRATED CURRENT SENSING

(75) Inventor: Chad Hartzog, Kokomo, IN (US)

(73) Assignee: EnerDel, Inc., Indianapolis, IN (US)

( * ) Notice: Subject to any disclaimer, the term of this patent is extended or adjusted under 35 U.S.C. 154(b) by 38 days.

(21) Appl. No.: 12/271,011

(22) Filed: Nov. 14, 2008

(65) Prior Publication Data

US 2009/0184797 A1 Jul. 23, 2009

Related U.S. Application Data

(60) Provisional application No. 60/987,977, filed on Nov. 14, 2007.

(51) Int. Cl.
*H01H 85/04* (2006.01)

(52) U.S. Cl. ........ 337/292; 337/187; 337/159; 337/164; 337/290

(58) Field of Classification Search .................. 337/159, 337/164, 290, 292, 187
See application file for complete search history.

(56) References Cited

U.S. PATENT DOCUMENTS

| | | | | |
|---|---|---|---|---|
| 1,353,123 A | * | 9/1920 | Kries ............................. | 337/229 |
| 2,111,749 A | * | 3/1938 | Bussmann ..................... | 337/164 |
| 2,337,504 A | * | 12/1943 | Strom ............................ | 337/158 |
| 2,400,408 A | * | 5/1946 | Haefelfinger ................... | 337/17 |
| 2,548,491 A | * | 4/1951 | Peek, Jr. ......................... | 361/104 |
| 3,735,312 A | * | 5/1973 | Nagel ............................. | 337/164 |
| 3,958,206 A | * | 5/1976 | Klint .............................. | 337/406 |
| 4,616,207 A | * | 10/1986 | Knapp et al. ................. | 338/32 H |
| 4,661,807 A | * | 4/1987 | Panaro .......................... | 340/638 |
| 5,198,791 A | * | 3/1993 | Shibayama et al. ............ | 337/31 |
| 5,923,515 A | * | 7/1999 | Eubanks et al. ............... | 361/104 |
| 6,445,276 B2 | * | 9/2002 | Schon et al. ................... | 337/184 |
| 6,445,563 B1 | * | 9/2002 | Endo .............................. | 361/250 |
| 2002/0109574 A1 | * | 8/2002 | Handcock et al. ............ | 337/292 |
| 2006/0017540 A1 | * | 1/2006 | Smith ............................ | 337/242 |
| 2006/0028314 A1 | * | 2/2006 | Furuuchi ........................... | 337/4 |
| 2008/0111658 A1 | * | 5/2008 | Yang .............................. | 337/242 |
| 2008/0165461 A1 | * | 7/2008 | Paik et al. ....................... | 361/87 |

FOREIGN PATENT DOCUMENTS

| | | | |
|---|---|---|---|
| DE | 19735546 A1 | * | 2/1999 |
| DE | 19735552 A1 | * | 2/1999 |
| JP | 11273544 A | * | 10/1999 |
| JP | 2007035535 A | * | 2/2007 |

* cited by examiner

*Primary Examiner* — Anatoly Vortman
(74) *Attorney, Agent, or Firm* — Ice Miller LLP

(57) ABSTRACT

A fuse assembly includes a main component partially encased in a protective sheath. The main component includes a pair of connectors formed of an electrically conductive material to allow the fuse assembly to be electrically connected into an electric vehicle drive system. A fusible link is electrically connected between the connectors and is preferably encased in the protective sheath. The fusible link reacts to current flowing through the fuse assembly in excess of a predetermined current for a predetermined time, as is well known to those skilled in the art.

17 Claims, 1 Drawing Sheet

FUSE ASSEMBLY WITH INTEGRATED CURRENT SENSING

RELATED APPLICATIONS

This application is a non-provisional patent application that claims priority to a provisional application Ser. No. 60/989,977 filed on Nov. 14, 2007 and incorporated herewith by reference in its entirety.

BACKGROUND OF THE INVENTION

1. Field of the Invention

The subject invention relates to a fuse assembly with integrated current sensing, primarily for use in the drive system of an electric or hybrid-electric vehicle.

2. Description of the Related Art

With the electrification of the drive systems of vehicles, there are several problems with the state of the art in current sensing methodologies. Given the high currents present and the need to sense the DC current, there are basically two options: (1) Non-contact Hall effect sensors or (2) Inline current shunt resistors.

Hall effect sensors have three primary problems. First, the sensors rely on sensing a static magnetic field. This static magnetic field can be affected by an external field imposed on the drive system and also by switching noise on the lines themselves. Second, depending on the design, Hall effect sensors are sensitive to the mechanical mounting of the system and can exhibit variations based on their installation methods. Third, Hall effect sensors are less accurate than equivalent current shunt methodologies.

Inline current shunt resistors have their own limitations. The dissipation power caused by the current requires that the resistance of the resistive element be of an extremely small value. This means that a metalized shunt is required to maintain a reasonable size. This thermal profile generally also requires the shunt to be mounted off-board or in a leaded device, i.e., a device with electrical conductors connected to the device.

Second, it is necessary to physically insert the resistance of the current shunt resistor into the current path. This both adds to the mechanical complexity, and adds additional impedance into the drive system. The impedance comes as both the resistance of the element, as well as in additional connection points in the system. Third, if the shunt becomes thermally stressed due to an over current conditions, its electrical resistance changes.

There is a current need for improved sensing devices that will eliminate one or more problems associated with the prior art sensing devices.

SUMMARY OF THE INVENTION

A fuse assembly includes a main component. The main component is partially encased in a protective sheath formed of an electrically insulating, i.e., non-conductive, material. The main component includes a pair of connectors formed of an electrically conductive material, such as a metal. The connectors allow the fuse assembly to be electrically connected into a larger system, such as an electric vehicle drive system. A fusible link is electrically connected between the connectors and is preferably encased in the protective sheath. The fusible link melts or otherwise dissipates when subjected to current flowing through the fuse assembly in excess of a predetermined current for a predetermined time, as is well known to those skilled in the art. A current sensing element is also electrically connected between the connectors. The current sensing element includes a resistor which is commonly referred to as a current shunt resistor. The current sensing element includes a pair of terminals electrically connected on either side of the resistor such that the voltage across the resistor may be measured. By measuring the voltage, and knowing the resistance of the resistor, the current flowing through the current sensing element, and the fuse assembly as a whole, may be easily calculated.

Typically, electric vehicle drive systems require the fusible link for short circuit safety protection. In the event that the fusible link blows, the fuse assembly will be required to be replaced. In replacing the fuse assembly, the current sensing element is also replaced. Therefore, the current sensing element will be maintained within tolerances. In the illustrated embodiment, the fusible link is connected to one of the connectors, the current sensing element is connected to the other connector, and a linking piece formed of an electrically conductive material, such as metal, is connected between the fusible link and the current sensing element.

A pair of external terminals is electrically connected to the terminals of the current sensing element. The external terminals are disposed at least partially on an exterior of the protective sheath to allow connection of a voltage sensor (not shown) or other such measurement apparatus (not shown) to the fuse assembly.

An advantage of the present invention is to provide a fuse assembly that is simple to design and manufacture.

Another advantage of the present invention is to provide a fuse assembly that reduces additional impedance into the drive system.

BRIEF DESCRIPTION OF THE DRAWINGS

Advantages of the present invention will be readily appreciated, as the same becomes better understood by reference to the following detailed description when considered in connection with the accompanying drawings wherein.

DETAILED DESCRIPTION OF THE INVENTION

Referring to the Figures, wherein like numerals indicate corresponding parts throughout the several views, a fuse assembly with integrated current sensing is shown at 10.

Figure 1:
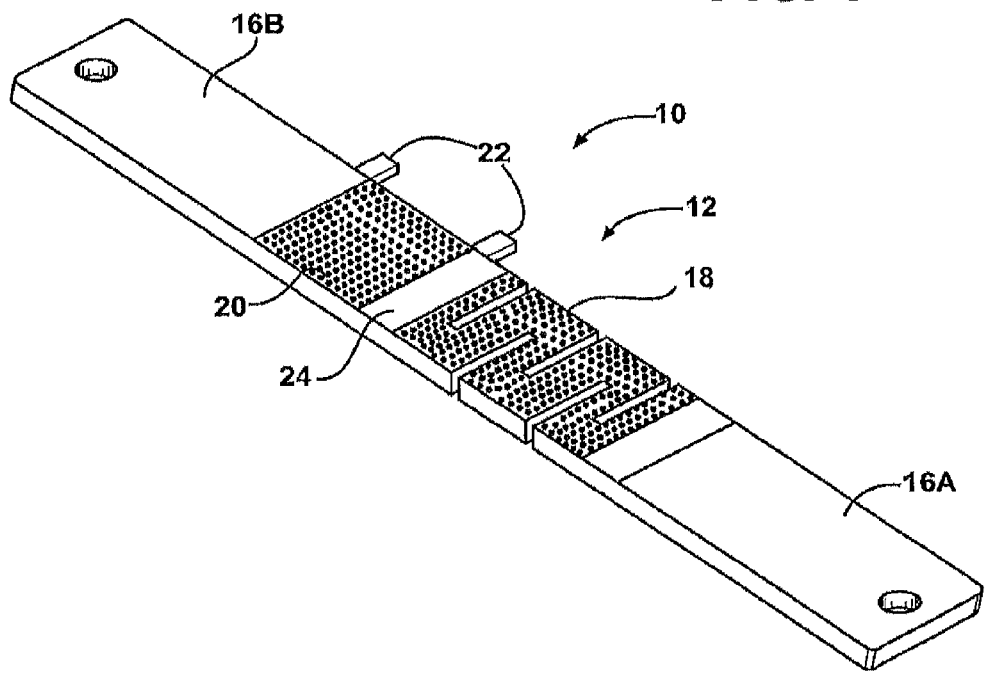
FIG. 1 is perspective view of a fuse assembly of the subject invention.
Figure 2:
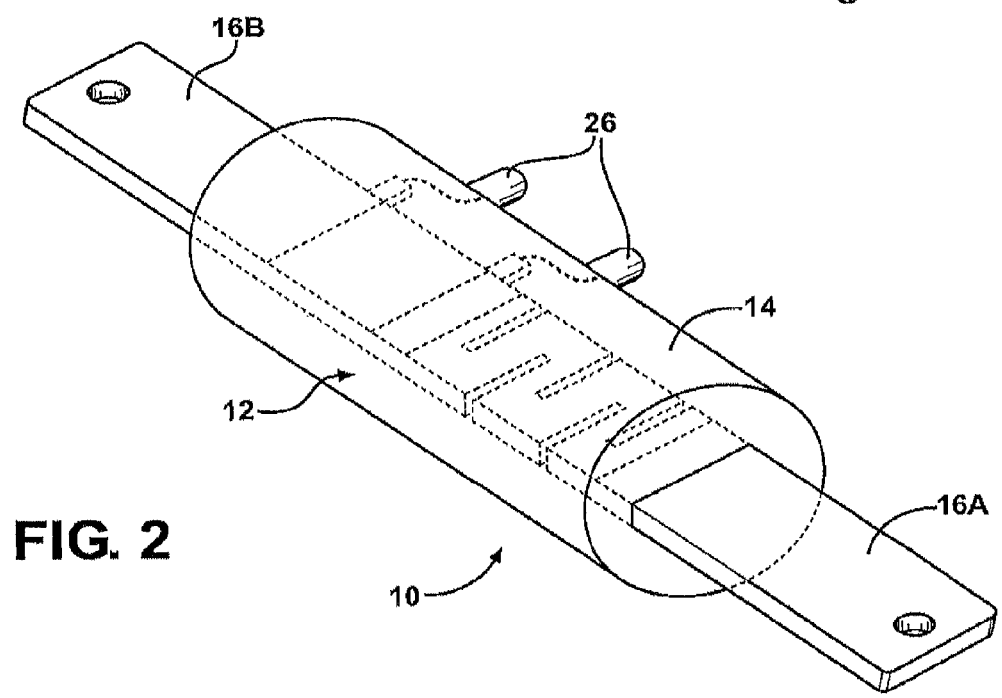
FIG. 2 is a perspective view of the fuse assembly showing the main component of the fuse assembly.

As shown in FIG. 1, the fuse assembly 10 includes a main component 12. Preferably, as shown in FIG. 2, the main component 12 is partially encased in a protective sheath 14 formed of an electrically insulating, i.e., non-conductive, material.

The main component 12 includes a pair of connectors 16A, 16B formed of an electrically conductive material, such as a metal. The connectors 16A, 16B allow the fuse assembly 10 to be electrically connected into a larger system (not shown), such as an electric vehicle drive system (not shown).

A fusible link 18 is electrically connected between the connectors 16A, 16B and is preferably encased in the protective sheath 14. The fusible link 18 melts or otherwise dissipates when subjected to current flowing through the fuse assembly 10 in excess of a predetermined current for a predetermined time, as is well known to those skilled in the art.

A current sensing element 20 is also electrically connected between the connectors 16A, 16B. The current sensing element 20 includes a resistor (not shown) which is commonly referred to as a current shunt resistor. The current sensing element 20 includes a pair of terminals 22 electrically connected on either side of the resistor such that the voltage across the resistor may be measured. By measuring the voltage, and knowing the resistance of the resistor, the current flowing through the current sensing element 20, and the fuse assembly 10 as a whole, may be easily calculated.

In one embodiment, the current sensing element 20 may be implemented using a SPR3004 manufactured by Vishay Intertechnology, Inc. of Malvern, Pa., USA. Of course, other sources and configurations for the current sensing element 20 may be realized by those skilled in the art.

Typically, electric vehicle drive systems require the fusible link 18 for short circuit safety protection. In the event that the fusible link 18 blows, the fuse assembly 10 will be required to be replaced. In replacing the fuse assembly 10, the current sensing element 20 is also replaced. Therefore, the current sensing element 20 will be maintained within tolerances.

In the illustrated embodiment, the fusible link 18 is connected to one of the connectors 16A, the current sensing element 20 is connected to the other connector 16B, and a linking piece 24 formed of an electrically conductive material, such as metal, is connected between the fusible link 18 and the current sensing element 20.

A pair of external terminals 26 is electrically connected to the terminals 22 of the current sensing element 10. The external terminals 26 are disposed at least partially on an exterior of the protective sheath 14 to allow connection of a voltage sensor (not shown) or other such measurement apparatus (not shown) to the fuse assembly 10.

While the invention has been described as an example embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A fuse assembly comprising:
   a first connector formed of a conductive material;
   a fusible link electrically connected to said first connector, said fusible link being dissipated as current flowing through said fuse assembly exceeds a predetermined current for a predetermined time;
   a current sensing element electrically connected to said fusible link, the current sensing element comprising a first terminal, a resistor, and a second terminal, the first terminal and the second terminal connected to the resistor at relative opposite ends of the resistor so that a voltage across the resistor can be measured using the first terminal and the second terminal; and
   a second connector electrically connected to said current sensing element, said second connector formed of a conductive material, whereby said second connector does not directly electrically connect to said fusible link.

2. A fuse assembly as set forth in claim 1, including a protective cover encapsulating said fusible link and said current sensing element.

3. A fuse assembly as set forth in claim 2, wherein said protective cover is formed of an electrically insulating and non-conductive material.

4. A fuse assembly as set forth in claim 1, wherein the first connector and second connector are capable of electrical connection to a drive system of a vehicle.

5. A fuse assembly as set forth in claim 1, including a pair of external terminals electrically connected to said first and second terminals of the current sensing element.

6. A fuse assembly as set forth in claim 5, including a protective cover encapsulating said fusible link and said current sensing element wherein said pair of external terminals are disposed at least partially on an exterior of said protective cover to allow connection of a voltage sensor to said fuse assembly.

7. A fuse assembly as set forth in claim 1, whereby dissipation of said fusible link prevents a flow of current between said first connector and said second connector.

8. A fuse assembly, comprising:
   a first connector formed of a conductive material;
   a fusible link electrically connected to said first connector, said fusible link being dissipated as current flowing through said fuse assembly exceeds a predetermined current for a predetermined time;
   a current sensing element connected to said fusible link, the current sensing element comprising a first terminal, a resistor, and a second terminal, the first terminal and the second terminal connected to the resistor at relative opposite ends of the resistor so that a voltage across the resistor can be measured using the first terminal and the second terminal; and
   a second connector formed of a conductive material, said second connector electrically connected to said current sensing element;
   whereby said first connector, said fusible link, said current sensing element, and said second connector are serially connected.

9. A fuse assembly as set forth in claim 8, whereby dissipation of said fusible link prevents said flow of current between said first connector and said second connector.

10. A fuse assembly as set forth in claim 8, including a protective cover encapsulating said fusible link and said current sensing element.

11. A fuse assembly as set forth in claim 10, wherein said protective cover is formed of an electrically insulating and non-conductive material.

12. A fuse assembly as set forth in claim 8, the first connector and second connector are capable of electrical connection to a drive system of a vehicle.

13. A fuse assembly as set forth in claim 8, including a first pair of external terminals electrically connected to said first and second terminals of said current sensing element.

14. A fuse assembly as set forth in claim 13, including a protective cover encapsulating said fusible link and said current sensing element wherein said pair of external terminals are disposed at least partially on an exterior of said protective cover to allow connection of a voltage sensor to said fuse assembly.

15. A fuse assembly, comprising:
   a first connector formed of a conductive material;
   a fusible link electrically connected to said first connector, said fusible link being dissipated as current flowing through said fuse assembly exceeds a predetermined current for a predetermined time;
   a current sensing element connected to said fusible link, the current sensing element comprising a first terminal, a resistor, and a second terminal, the first terminal and the second terminal connected to the resistor at relative opposite ends of the resistor so that a voltage across the resistor can be measured using the first terminal and the second terminal;
   a protective cover encapsulating said fusible link and said current sensing element; and a second connector formed of a conductive material, said second connector electrically connected to said current sensing element;

wherein said first connector and second connector are operable to allow said fuse assembly to be electrically connected to a drive system of a vehicle; and whereby said first connector, said fusible link, said current sensing element, and said second connector are serially connected.

16. A fuse assembly as set forth in claim 15, wherein said protective cover is formed of an electrically insulating and non-conductive material.

17. A fuse assembly comprising:

a first connector formed of a conductive material;

a fusible link electrically connected to said first connector, said fusible link being dissipated as current flowing through said fuse assembly exceeds a predetermined current for a predetermined time;

a current sensing element comprising a first terminal, a resistor, and second terminal, the first terminal and the second terminal connected to the resistor at relative opposite ends of the resistor so that a voltage across the resistor can be measured using the first terminal and the second terminal;

a linking element coupled between said fusible link and said current sensing element, said linking element providing an electrical connection between said fusible link and said current sensing element; and a second connector electrically connected to said current sensing element, said second connector formed of a conductive material, whereby said second connector does not directly electrically connect to said fusible link.

* * * * *